(12) United States Patent
Chang

(10) Patent No.: US 9,532,483 B1
(45) Date of Patent: Dec. 27, 2016

(54) QUICK RELEASE BRACKET ASSEMBLY

(71) Applicant: Nan Juen International Co., Ltd., New Taipei (TW)

(72) Inventor: Fu-Tien Chang, New Taipei (TW)

(73) Assignee: NAN JUEN INTERNATIONAL CO., LTD., New Taipei (TW)

( * ) Notice: Subject to any disclaimer, the term of this patent is extended or adjusted under 35 U.S.C. 154(b) by 0 days.

(21) Appl. No.: 14/801,677

(22) Filed: Jul. 16, 2015

(51) Int. Cl.
*F16M 13/00* (2006.01)
*H05K 7/14* (2006.01)
*F16M 13/02* (2006.01)
*F16B 2/12* (2006.01)

(52) U.S. Cl.
CPC .............. *H05K 7/1489* (2013.01); *F16B 2/12* (2013.01); *F16M 13/022* (2013.01)

(58) Field of Classification Search
CPC ............... A47B 2200/0069; A47B 2200/0083; A47B 2200/0085; A47B 2210/0027; A47B 2210/0048; A47B 2210/0064; A47B 2210/0086; A47B 2210/0091; A47B 2210/08; A47B 2210/094; A47B 2220/0011; A47B 2220/0066; A47B 88/044; A47B 8/10; A47B 88/047; A47B 2210/0059; A47B 88/0422; A47B 88/04; A47B 2210/0032; A47B 88/14; A47B 2210/0094; A47B 88/08; A47B 2210/0081; A47B 67/04; A47B 88/16; A47B 2088/04

USPC ............................ 248/235, 241, 250, 220.21, 220.22,248/224.7; 211/26; 312/334.1, 334.5, 223.1, 312/223.2, 334.7, 334.8
See application file for complete search history.

(56) References Cited

U.S. PATENT DOCUMENTS

| | | | |
|---|---|---|---|
| 6,935,711 B1* | 8/2005 | Naue .................... | A47B 88/044 312/223.1 |
| 7,703,734 B2* | 4/2010 | Chen .................... | A47B 88/044 108/108 |
| 8,408,506 B2* | 4/2013 | Yu ........................ | H05K 7/1489 248/219.1 |
| 8,550,416 B2* | 10/2013 | Yu ........................ | H05K 7/1489 248/241 |
| 2009/0261699 A1* | 10/2009 | Yu ........................ | A47B 88/044 312/334.46 |

* cited by examiner

*Primary Examiner* — Steven Marsh

(57) ABSTRACT

A quick release bracket assembly includes a bracket, a locating device affixed to one end of the bracket, a positioning plate slidably coupled to the bracket and movable toward or away from the locating device, and a locking device movably mounted at the positioning plate and providing a spring member for pulling the positioning plate in direction toward said locating device. In installation in a rack, pull the positioning plate away from the locating device, and then attach the locating device to the rack, and then release the hand from the positioning plate for enabling the positioning plate to be pulled back by the spring member into engagement with the locating device.

3 Claims, 10 Drawing Sheets

QUICK RELEASE BRACKET ASSEMBLY

BACKGROUND OF THE INVENTION

1. Field of the Invention

The present invention relates to quick release bracket technology and more particularly, to a quick release bracket assembly, which allows movement of a positioning plate on the surface of a bracket relative to a locating device between a locking position and an unlocking position, facilitating quick mounting and dismounting.

2. Description of the Related Art

When mounting a sliding rail in a housing of a computer server, the sliding rail is connected to a bracket, and then the bracket is fastened to the inside of the housing of the computer server. After installation, sliding rails and brackets are disposed at different elevations inside the housing of the computer housing. When detaching one sliding rail and the associating bracket from the housing of the computer server, the sliding rail and the associating bracket cannot be detached in the vertical direction. According to the conventional technique, the dismounting operation is performed from the front side of the bracket. This front dismounting design is complicated and inconvenient to install.

SUMMARY OF THE INVENTION

The present invention has been accomplished under the circumstances in view. It is therefore the main object of the present invention to provide a quick release bracket assembly, which has a simple structure and allows movement of a positioning plate on the surface of a bracket relative to a locating device between a locking position and an unlocking position, facilitating quick mounting and dismounting.

It is another object of the present invention to provide a quick release bracket assembly, which utilizes the locking hole of the positioning plate and the locking device at the positioning plate to achieve different locking status between the locking device and the positioning plate after positioning between the positioning plate and the locating device, widening the range of applications.

To achieve these and other objects of the present invention, a quick release bracket assembly comprises a bracket, a locating device affixed to one end of the bracket, a positioning plate slidably coupled to the bracket and movable toward or away from the locating device, and a locking device movably mounted at the positioning plate and providing a spring member for pulling the positioning plate in direction toward said locating device. In installation in a rack, pull the positioning plate away from the locating device, and then attach the locating device to the rack, and then release the hand from the positioning plate for enabling the positioning plate to be pulled back by the spring member into engagement with the locating device. Similarly, when detaching the bracket from the rack, the user simply needs to pull the positioning plate in direction away from the locking device, facilitating dismounting.

Further, the bracket comprises a position-limit slot. The position-limit slot defines a plurality of position-limit protrusions and a plurality of position-limit grooves alternatively arranged along one side edge thereof. The positioning plate comprises a locking hole. The locking hole defines a displacement groove, a first positioning groove disposed in communication with the displacement groove at one lateral side, and a second positioning groove disposed in communicaiton with the first positioning groove at an opposite side. By selectively positioning the locating member of the locking device in the first positioning groove or second positioning groove, the positioning plate is locked to the bracket to hold the locating device and the positioning plate firmly at two opposite sides of the rack.

DETAILED DESCRIPTION OF THE PREFERRED EMBODIMENT

Figure 1:
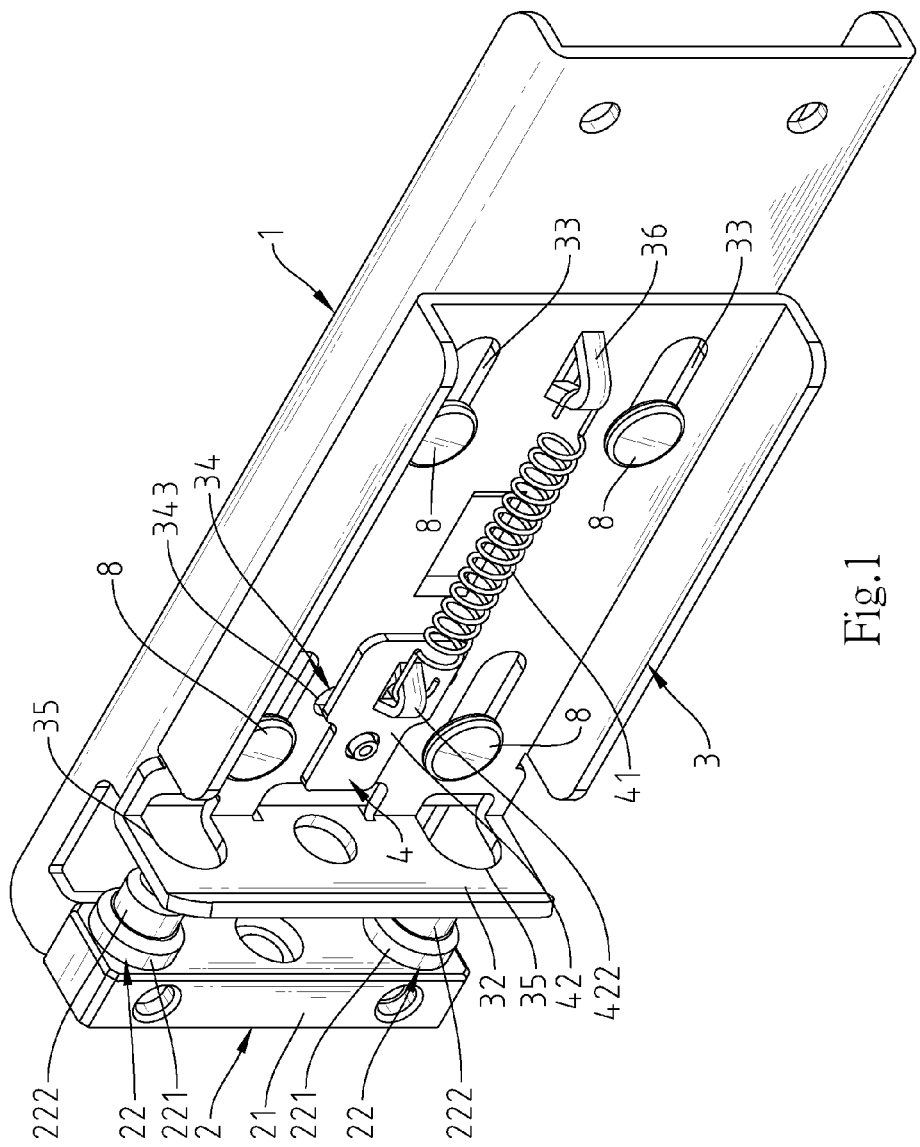
FIG. 1 is an oblique top elevational view of a quick release bracket assembly in accordance with the present invention.
Figure 2:
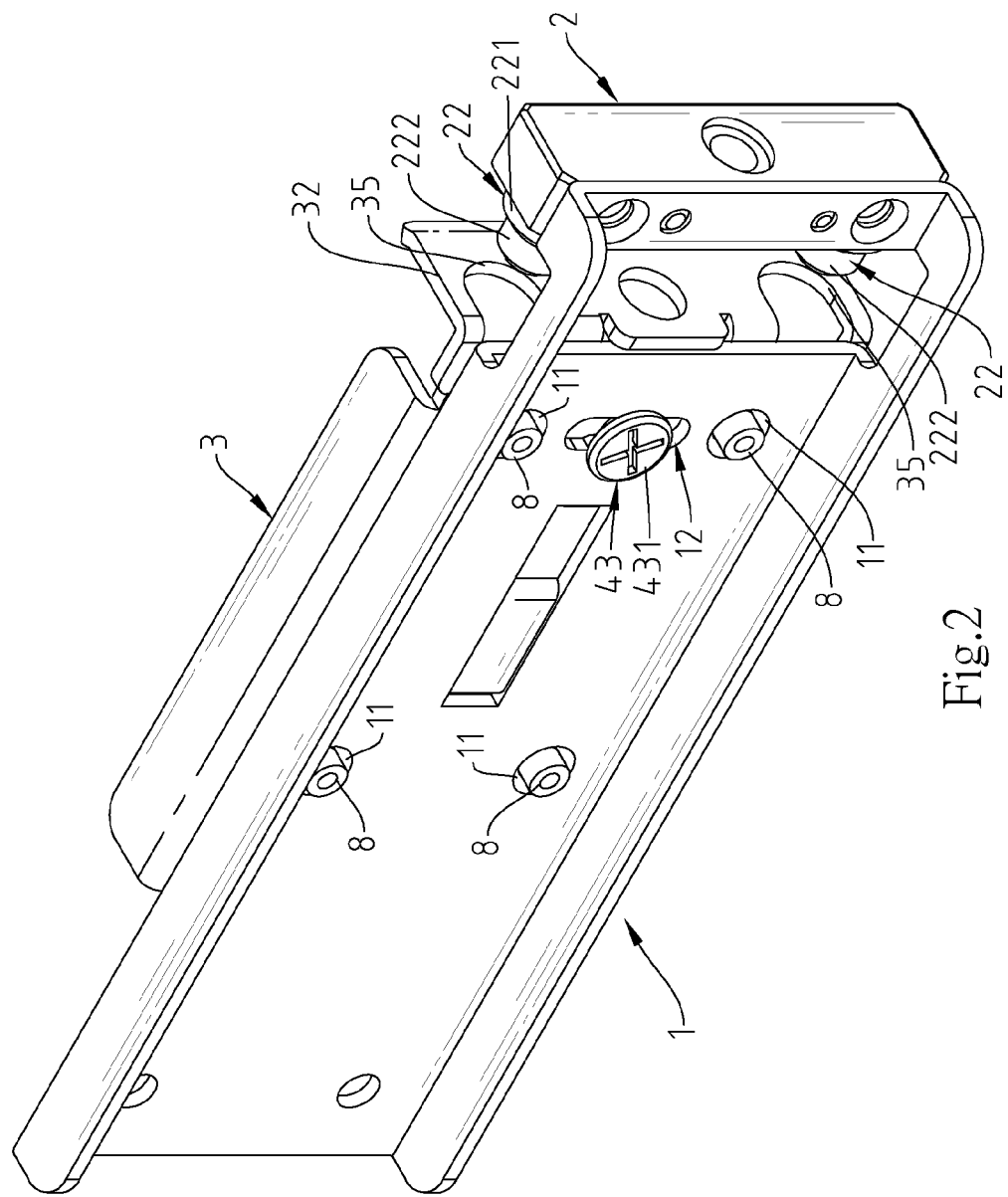
FIG. 2 corresponds to FIG. 1 when viewed from another angle.
Figure 3:
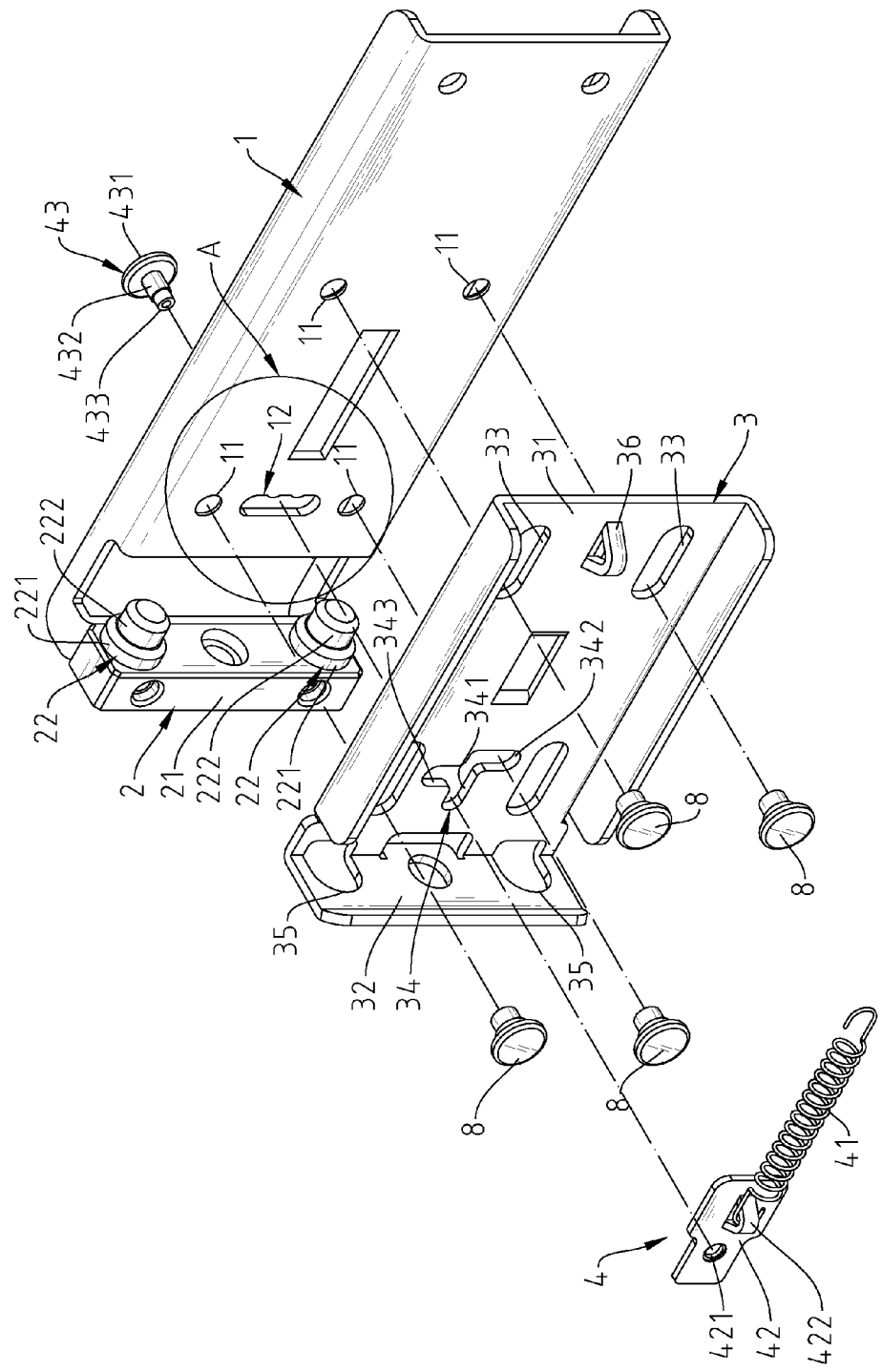
FIG. 3 is an exploded view of the quick release bracket assembly in accordance with the present invention.
Figure 4:
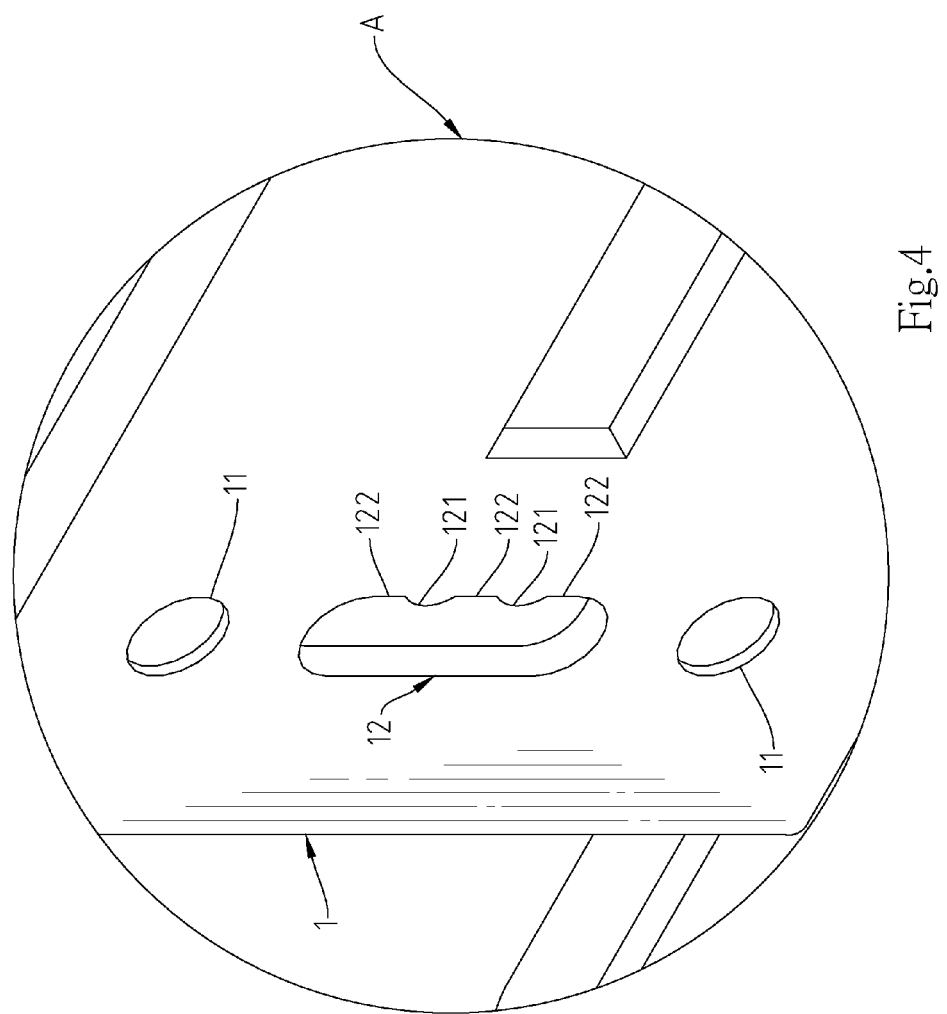
FIG. 4 is an enlarged view of Part A of FIG. 3.

Referring to FIGS. 1-4, a quick release bracket assembly in accordance with the present invention is shown. The quick release bracket assembly comprises a bracket 1, a locating device 2, a positioning plate 3 and a locking device 4.

The bracket 1 comprises a plurality of locating holes 11 and a position-limit slot 12. The position-limit slot 12 defines a plurality of position-limit protrusions 121 and a plurality of position-limit grooves 122 alternatively arranged along one side edge thereof.

The locating device 2 comprises a base frame 21, and a plurality of locating rods 22 located at a top surface of the base frame 21. The base frame 21 is fixedly mounted at one side of the bracket 1 in such a manner that the locating rods 22 extend in direction toward the position-limit slot 12 of the bracket 1. Further, the locating rods 22 are stepped rod members, each ach comprising a first locating rod portion 221 outwardly extended from the base frame 21 and having a relatively larger outer diameter, and a second locating rod portion 22 axially outwardly extended from the first locating rod portion 221 remote from the base frame 21 and having a relatively smaller outer diameter smaller than the outer diameter of the first locating rod portion 221.

The positioning plate 3 comprises a base panel 31, a positioning panel 32 extended from the base panel 31 at right angles, a plurality of elongated sliding slots 33 and a locking hole 34 located in the base panel 31, a second positioning protruding portion 36 raised from the surface of the base panel 31 at a location remote from the locking hole 34, and a plurality of positioning holes 35 located in the positioning panel 32 corresponding to the locating rods 22 of the locating device 2. Pivot bolts 8 are respectively inserted through the elongated sliding slots 33 of the base panel 31 and affixed to the respective locating holes 11 of the bracket 1 to secure the positioning plate 3 to the bracket 1 and to keep the positioning holes 35 in alignment with the respective locating rods 22 of the locating device 2, allowing movement of the positioning plate 3 toward or away from the locating device 2. The locking hole 34 defines a displacement groove 341, a first positioning groove 342 disposed in communication with the displacement groove 341 at one lateral side and relatively closer to the positioning panel 32, and a second positioning groove 343 disposed in communicaiton with the first positioning groove 342 at an opposite side and at a location relatively farther from the positioning panel 32.

The locking device 4 comprises a spring member 41, a locking plate 42 and a locating member 43. The locating member 43 comprises a stop head 431, a locating shank 432 perpendicularly extended from the top head 431, and a mounting portion 433 located at a distal end of the locating shank 432 remote from the stop head 431. The locking plate 42 is supported on the surface of the base panel 31 of the positioning plate 3, comprising a mounting hole 421 and a first positioning protruding portion 422. The mounting portion 433 of the locating member 43 is fixedly fastened to the mounting hole 421 of the locking plate 42. The stop head 431 of the locating member 43 is stopped at a bottom surface of the bracket 1. The locating shank 432 of the locating member 43 is inserted through the position-limit slot 12 of the bracket 1 and the locking hole 34 of the positioning plate 3. The spring member 41 has two opposite ends thereof respectively connected to the first positioning protruding portion 422 of the locking plate 42 and the second positioning protruding portion 36 of the base panel 31 of the positioning plate 3 to pull the positioning plate 3 in direction toward the locating device 2.

Figure 5:
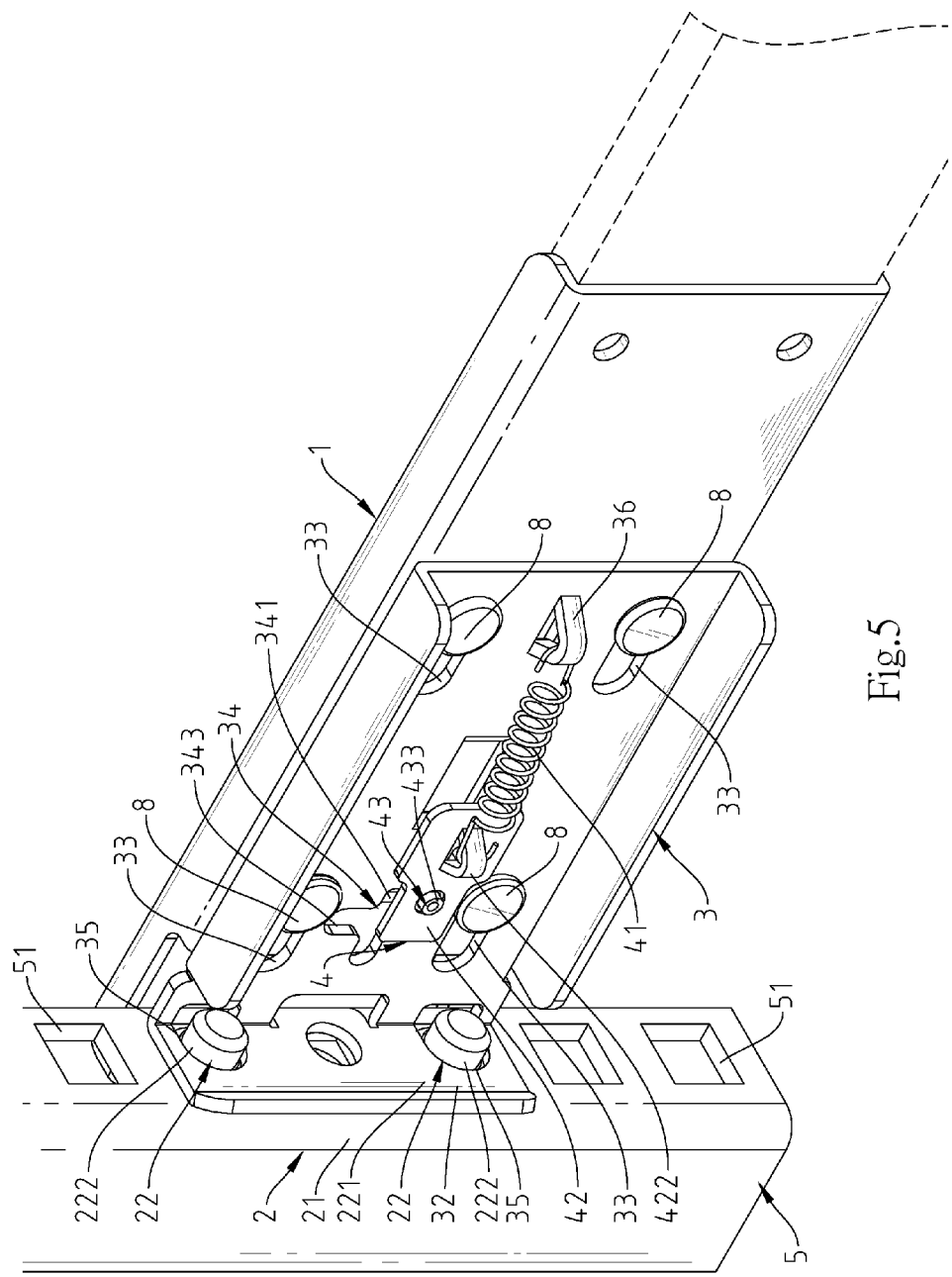
FIG. 5 is a schematic applied view of the present invention, illustrating the quick release bracket assembly installed in a rack (I).
Figure 6:
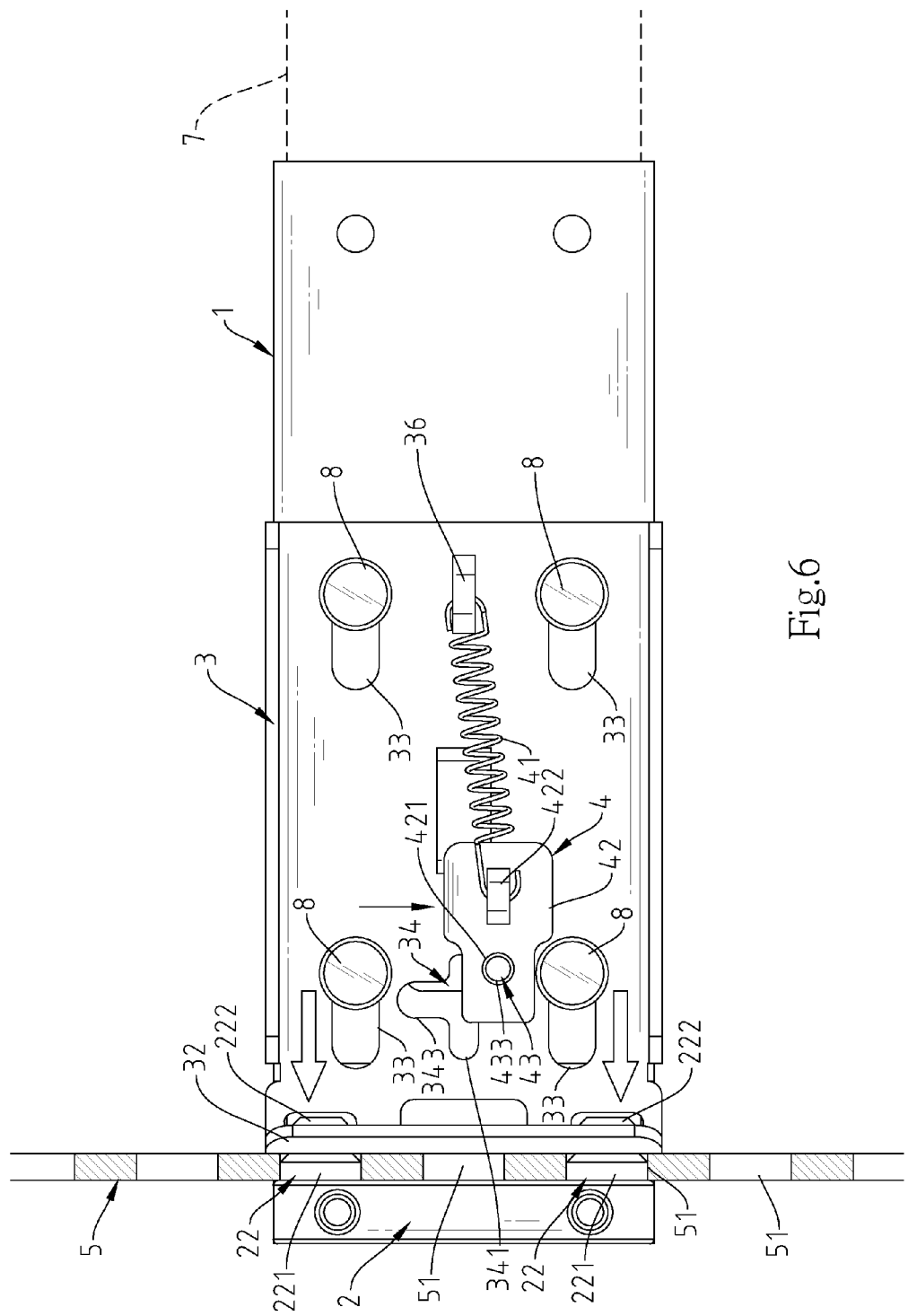
FIG. 6 is a schematic applied view of the present invention, illustrating the quick release bracket assembly installed in a rack (II).
Figure 7:
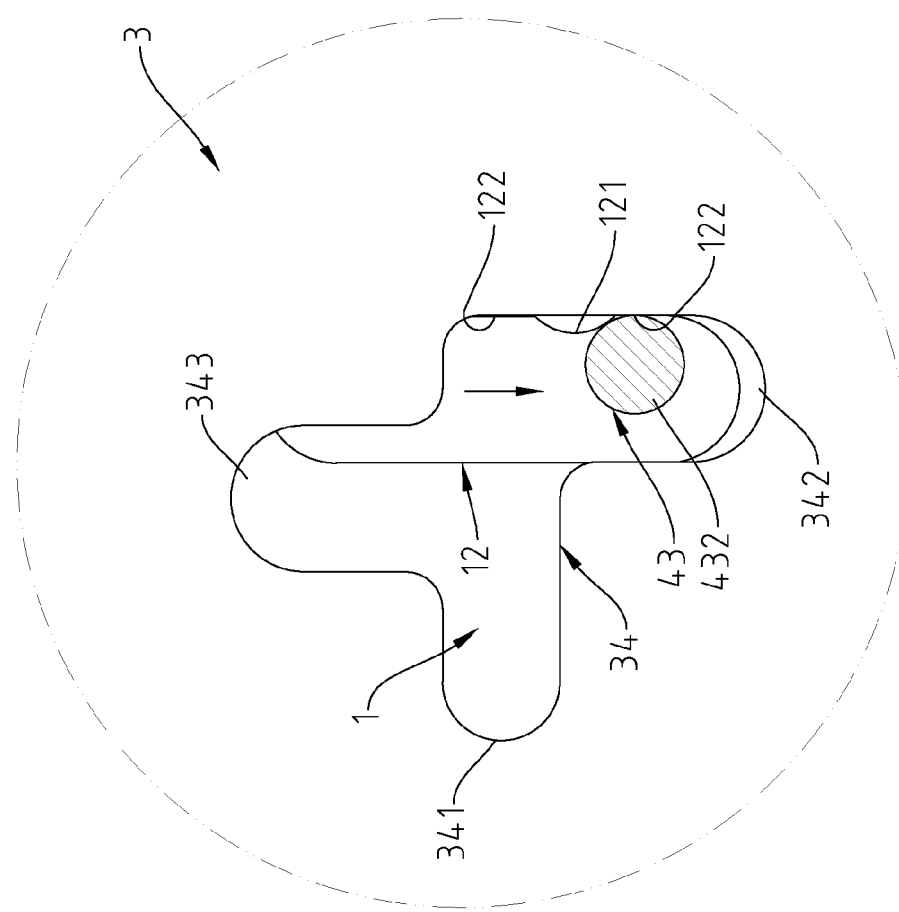
FIG. 7 is an enlarged view of a part of FIG. 6.

Referring to FIGS. 5-7 and FIGS. 1-4 again, when using the quick release bracket assembly, as illustrated in FIG. 5, pull the positioning plate 3 in direction away from the locating device 2 to disengage the positioning holes 35 of the positioning plate 3 from the respective locating rods 22 of the locating device 2, and then insert the locating rods 22 of the locating device 2 into respective through holes 51 of a rack 5, and then release the positioning plate 3 from the hand for enabling the positioning plate 3 to be pulled by the elastic restoring energy of the spring member 41 toward the locating device 2 to force the respective positioning holes 35 of the positioning plate 3 into engagement with the respective locating rods 22 of the locating device 2, enabling the bracket 1 to be stably attached to a sliding rail 7. In this embodiment, the through holes 51 of the rack 5 are relatively larger than the diameter of the locating rods 22 of the locating device 2, allowing the first locating rod portion 221 of each locating rod 22 is positioned in one respective through hole 51. As illustrated in FIG. 6 and FIG. 7, the rack 5 is positioned in between the locating device 2 and the positioning plate 3, move the locking plate 42 of the locking device 4 to shift the locating shank 432 into the first positioning groove 342 of the locking hole 34 and one respective position-limit groove 122 of the bracket 1 to lock the positioning plate 3 to the bracket 1. At this time, the adjacent position-limit protrusion 121 stops the locating shank 432 in the position-limit groove 122 against vibration, holding the locating member 43 positively in the locking position. Similarly, when wishing to detach the bracket 1 from the rack 5, move the locking plate 42 of the locking device 4 to shift the locating shank 432 from the first positioning groove 342 into the displacement groove 341 so as to unlock the positioning plate 3 from the bracket 1, and then move the positioning plate 3 in direction away from the locating device 2 to disengage the positioning holes 35 of the positioning plate 3 from the respective locating rods 22 of the locating device 2, allowing removal of the bracket 1 from the rack 5.

Figure 8:
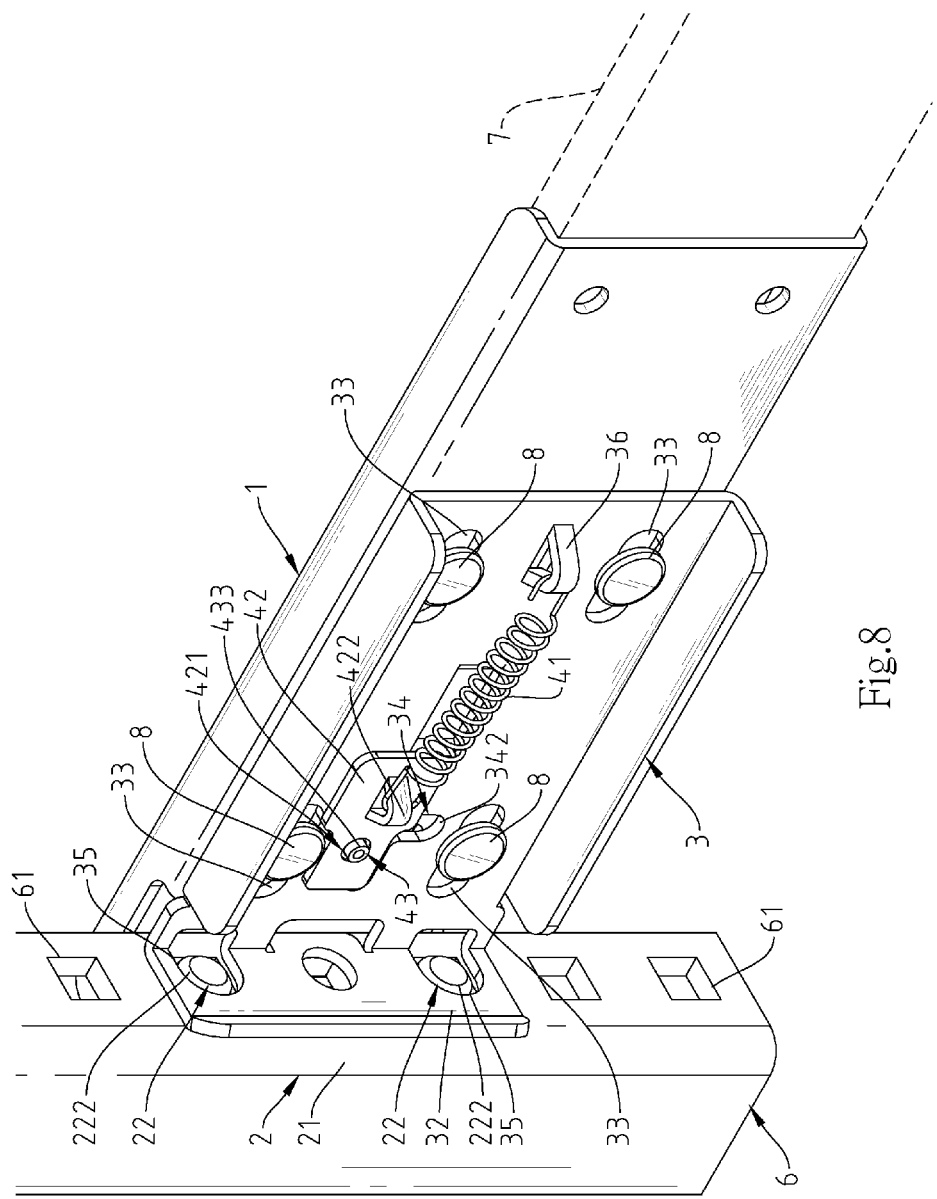
FIG. 8 is a schematic applied view of the present invention, illustrating the quick release bracket assembly installed in another design of rack (I).
Figure 9:
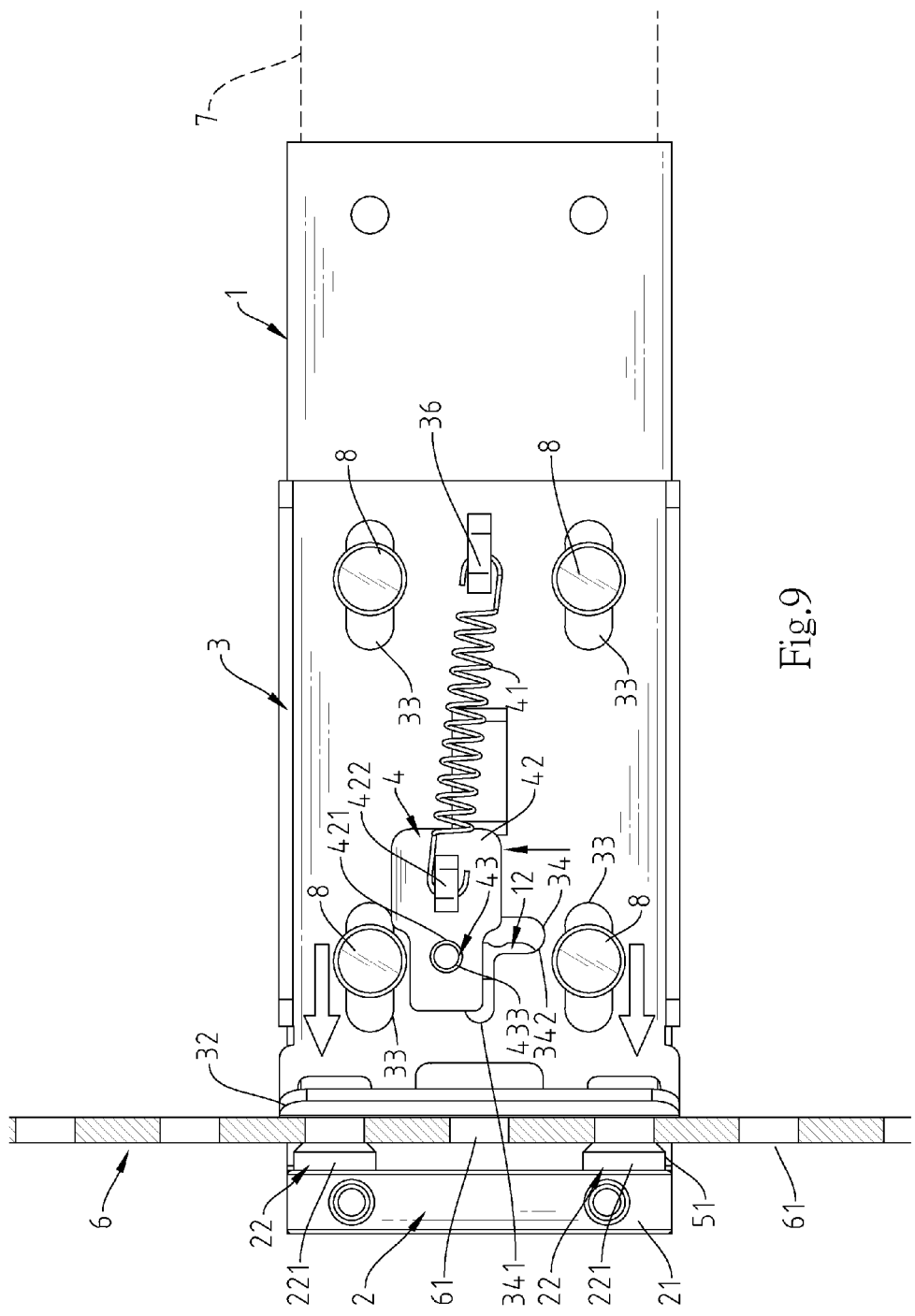
FIG. 9 is a schematic applied view of the present invention, illustrating the quick release bracket assembly installed in another design of rack (II).
Figure 10:
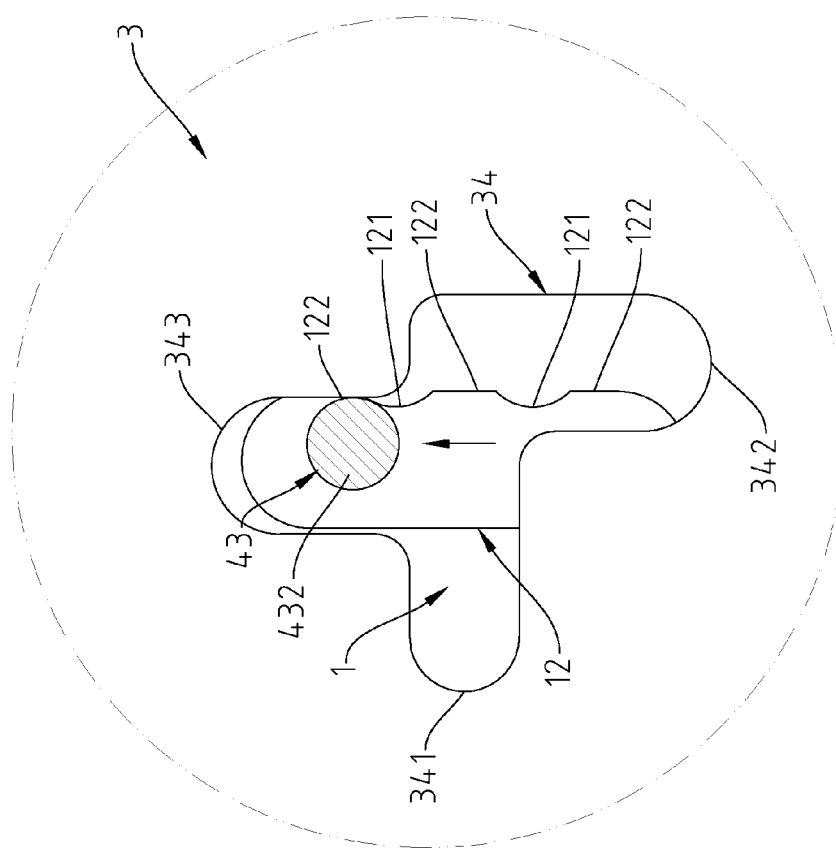
FIG. 10 is an enlarged view of a part of FIG. 9.

Referring to FIGS. 8-10, another application example of the quick release bracket assembly in accordance with the present invention is shown. This application example is substantially to the application example shown in FIGS. 5-7 with the exception that the through holes 61 of the rack 6 are relatively smaller, thus, each locating rod 22 is positioned in one respective through hole 61 by means of its second locating rod portion 222. Therefore, when the locking plate 42 of the locking device 4 locks the positioning plate 3 in position, the locating shank 432 of the locating member 43 is engaged into the second positioning groove 343 of the base panel 31 of the positioning plate 3.

What is claimed is:
1. A quick release bracket assembly, comprising:
a bracket comprising a plurality of locating holes and a position-limit slot, said position-limit slot defining a plurality of position-limit protrusions and a plurality of position-limit grooves alternately arranged along a side edge thereof;
a locating device comprising a base frame fixedly mounted at a side of said bracket and a plurality of locating rods located at a top surface of said base frame and extending in a direction toward said position-limit slot of said bracket;
a positioning plate comprising a base panel, a positioning panel extending from said base panel at right angles, a plurality of elongated sliding slots and a locking hole located in said base panel, a plurality of positioning holes located in said positioning panel corresponding to said locating rods of said locating device, wherein a plurality of pivot bolts are respectively inserted through said elongated sliding slots and affixed to the respective said locating holes of said bracket to secure said positioning plate to said bracket and to keep said positioning holes in alignment with the respective said locating rods of said locating device to allow movement of said positioning plate toward or away from said locating device to force said positioning holes into engagement with or away from said locating rods of said locating device, said locking hole defining a displacement groove, a first positioning groove disposed in communication with said displacement groove at a lateral side and relatively closer to said positioning panel and a second positioning groove disposed in communication with said first positioning groove at a location relatively farther from said positioning panel; and
a locking device comprising a spring member, a locking plate and a locating member, said locating member comprising a stop head and a locating shank extending from said stop head and terminating in a mounting portion, said locking plate being movably supported on said base panel of said positioning plate and defining therein a mounting hole, the mounting portion of said locating member being affixed to said mounting hole of said locking plate, the stop head of said locating member being stopped at a bottom surface of said bracket, the locating shank of said locating member being inserted through said position-limit slot of said bracket and said locking hole of said positioning plate, said spring member having two opposite ends thereof respectively connected to said locking plate and said base panel of said positioning plate and adapted to pull said positioning plate in a direction toward said locating device.

2. The quick release bracket assembly as claimed in claim 1, wherein each said locating rod is a stepped rod member comprising a first locating rod portion outwardly extending from said base frame and having a relatively larger outer diameter, and a second locating rod portion axially outwardly extending from said first locating rod portion remote from said base frame and having a relatively smaller outer diameter than the outer diameter of said first locating rod portion.

3. The quick release bracket assembly as claimed in claim 1, wherein said locking plate of said locking device comprises a first positioning protruding portion; and said base panel of said positioning plate comprises a second positioning protruding portion remote from said locking hole, said spring member having the two opposite ends thereof respectively connected to said first positioning protruding portion and said second positioning protruding portion.

* * * * *